US009536671B2

(12) United States Patent
Ramm et al.

(10) Patent No.: US 9,536,671 B2
(45) Date of Patent: Jan. 3, 2017

(54) PLANAR CAPACITOR TERMINALS

(71) Applicant: Tesla Motors, Inc., Palo Alto, CA (US)

(72) Inventors: Robert James Ramm, Mountain View, CA (US); Dino Sasaridis, San Francisco, CA (US); Colin Campbell, San Francisco, CA (US); Wenjun Liu, Santa Clara, CA (US)

(73) Assignee: TELSA MOTORS, INC., Palo Alto, CA (US)

( * ) Notice: Subject to any disclaimer, the term of this patent is extended or adjusted under 35 U.S.C. 154(b) by 189 days.

(21) Appl. No.: 14/557,256

(22) Filed: Dec. 1, 2014

(65) Prior Publication Data
US 2016/0155572 A1   Jun. 2, 2016

(51) Int. Cl.
*H02G 5/00* (2006.01)
*H01G 4/40* (2006.01)
*H01G 4/224* (2006.01)
*H05K 7/02* (2006.01)
*H01B 17/06* (2006.01)
*H02B 1/21* (2006.01)
*H02B 1/20* (2006.01)
*H01G 4/228* (2006.01)
*H02G 5/06* (2006.01)
*H01B 5/02* (2006.01)

(52) U.S. Cl.
CPC ............. *H01G 4/40* (2013.01); *H01B 17/06* (2013.01); *H01G 4/224* (2013.01); *H01G 4/228* (2013.01); *H02B 1/20* (2013.01); *H02B 1/21* (2013.01); *H02G 5/00* (2013.01); *H02G 5/005* (2013.01); *H05K 7/026* (2013.01)

(58) Field of Classification Search
CPC ............ H02G 5/00; H02G 5/005; H02B 1/20; H02B 1/21; H01B 17/06; H05K 2201/10272
USPC ................ 174/68.2, 70 B, 71 B, 72 B, 88 B, 99 B, 174/129 B, 133 B, 149 B; 361/624, 637, 639, 361/648, 775
See application file for complete search history.

(56) References Cited

U.S. PATENT DOCUMENTS

2008/0130223 A1*  6/2008  Nakamura ............ H02M 7/003
                                                      361/689
2012/0194119 A1   8/2012  Kroeze et al.
2012/0305283 A1* 12/2012  Kalayjian ............ H05K 7/1432
                                                      174/68.2

* cited by examiner

Primary Examiner — Binh Tran
(74) Attorney, Agent, or Firm — Garlick & Markison; Bruce E. Garlick

(57) ABSTRACT

An electronic component includes: a laminate busbar structure comprising at least two busbar layers separated by an insulating layer; a transistor connected to the laminate busbar structure on a first side thereof; and a capacitor that is mounted on the first side of the laminate busbar structure and is positioned further away from the laminate busbar structure than the transistor, the capacitor having respective planar terminals parallel to each other and perpendicular to the laminate busbar structure, each of the planar terminals comprising a rectangular member with one side thereof connected to the capacitor and an opposite end connected to a corresponding one of the busbar layers.

11 Claims, 3 Drawing Sheets

PLANAR CAPACITOR TERMINALS

BACKGROUND

Capacitors are used in a variety of electronic and other devices. One context of such use is in the area of power inverters, where a capacitor can be coupled to the switching elements in order to protect against transients, and to help maintain a voltage on the DC bus. These capacitors are usually referred to as DC link capacitors.

Also, thermal management is an important aspect of many electronic devices, particularly those that involve large currents, which is often the case with power inverters. One approach for protecting a component against thermal damage involves moving the component and the main heat source further apart from each other. However, this can have undesirable consequences such as lowering the efficiency and/or increasing the physical size of the device.

SUMMARY

In a first aspect, an electronic component includes: a laminate busbar structure comprising at least two busbar layers separated by an insulating layer; a transistor connected to the laminate busbar structure on a first side thereof; and a capacitor that is mounted on the first side of the laminate busbar structure and is positioned further away from the laminate busbar structure than the transistor, the capacitor having respective planar terminals parallel to each other and perpendicular to the laminate busbar structure, each of the planar terminals comprising a rectangular member with one side thereof connected to the capacitor and an opposite end connected to a corresponding one of the busbar layers.

Implementations can include any or all of the following features. The capacitor is enclosed in a housing and the planar terminals extend outside the housing. Each rectangular member extends from end to end of the housing. The electronic component further comprises a support structure for the rectangular members extending from the housing toward the laminate busbar structure. The support structure holds the planar terminals by their edges and exposes outward facing surfaces of the rectangular members. A portion of the support structure insulates the planar terminals from each other. The support structure and the rectangular members are configured to position a busbar locating component relative to the electronic component, the busbar locating component configured to have the laminate busbar structure attached thereto. The electronic component is an inverter that includes multiple transistors, the busbar layers include at least first and second DC busbar layers and an AC busbar layer, and the capacitor is a DC link capacitor for the inverter. Each of the planar terminals has multiple leads at the opposite end of the rectangular member, the leads connecting the respective planar terminal to the corresponding one of the busbar layers. Each of the busbar layers has openings with corresponding tabs extending from peripheries thereof, and each of the tabs is configured to align with and contact a corresponding one of the multiple leads. The leads of the respective planar terminals are paired and positioned adjacent a respective one of the multiple transistors.

DETAILED DESCRIPTION

This document describes examples of capacitors that are connected to the rest of an electronic device by way of one or more terminals having a relatively large planar shape. These terminal structure(s) can provide a capacitor that is thermally far away from the electronics, yet electrically close thereto. As such, there can be provided, for example, a low inductance capacitor with better thermal management.

Figure 1:
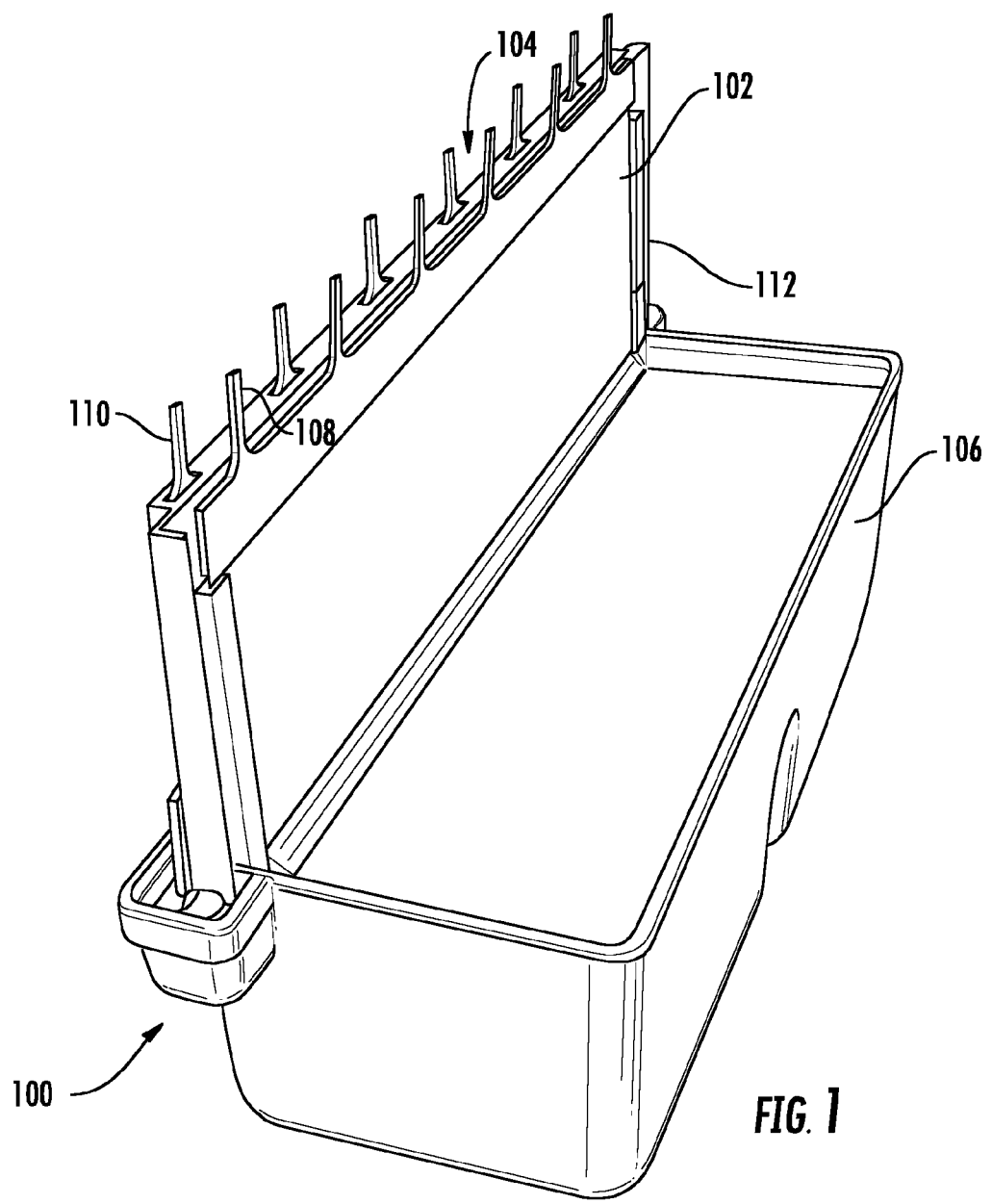
FIG. 1 shows an example of a capacitor with planar terminals.

FIG. 1 shows an example of a capacitor 100 with planar terminals 102 and 104. The electrical conductors of the capacitor are contained in a housing 106. Most of the terminal 102 outside the housing is visible in the illustration, whereas the terminal 104 is currently hidden except for the leads thereof extending at the top of the capacitor 100.

Any form of capacitor conductors can be used, including, but not limited to, films or foils (e.g., folded or rolled into a compact structure that fits inside the housing 106). For example, the housing can provide two or more compartments, each holding a respective portion of the capacitor. The housing can be made of any material that provides sufficient insulation and structural strength to the capacitor (e.g., a polymer).

Each of the planar terminals 102 and 104 comprises a rectangular member with one side thereof connected to the capacitor conductors inside the housing 106. The proportions of the portion of the terminal outside the housing can be chosen depending on the characteristics of the installation. In some implementations, the rectangular member can have a width to height ratio of approximately 3:1 or 4:1. For example, the terminal can be more than three times wider than it is tall. As another example, the ratio of width or height to thickness can be between approximately 50:1 and 200:1. Here, the portions of the terminals 102 and 104 outside the housing extend essentially from end to end of the housing 106, but other widths can be used. The planar terminals are made from a conductive material (e.g., copper).

Each of the planar terminals can have leads formed at one or more of its sides. Here, the terminal 102 has leads 108 and the terminal 104 has leads 110. In some implementations, the two terminals have the same numbers of leads, the respective leads arranged pair-wise along upper edges of the terminals. For example, in devices using multiple transistors, the leads of the respective planar terminals can be positioned adjacent a respective one of the multiple transistors.

The capacitor 100 has a support structure 112. For example, the support structure can be configured to hold the planar terminals 102 and 104 by their edges and expose outward facing surfaces thereof. The support structure can serve to electrically insulate the terminals from each other. As another example, the support structure can be configured to help position a busbar locating component (not shown) that is in turn used for holding other components of an electronic device. The support structure can be made from the same material as the housing, to name just one example.

Figure 2:
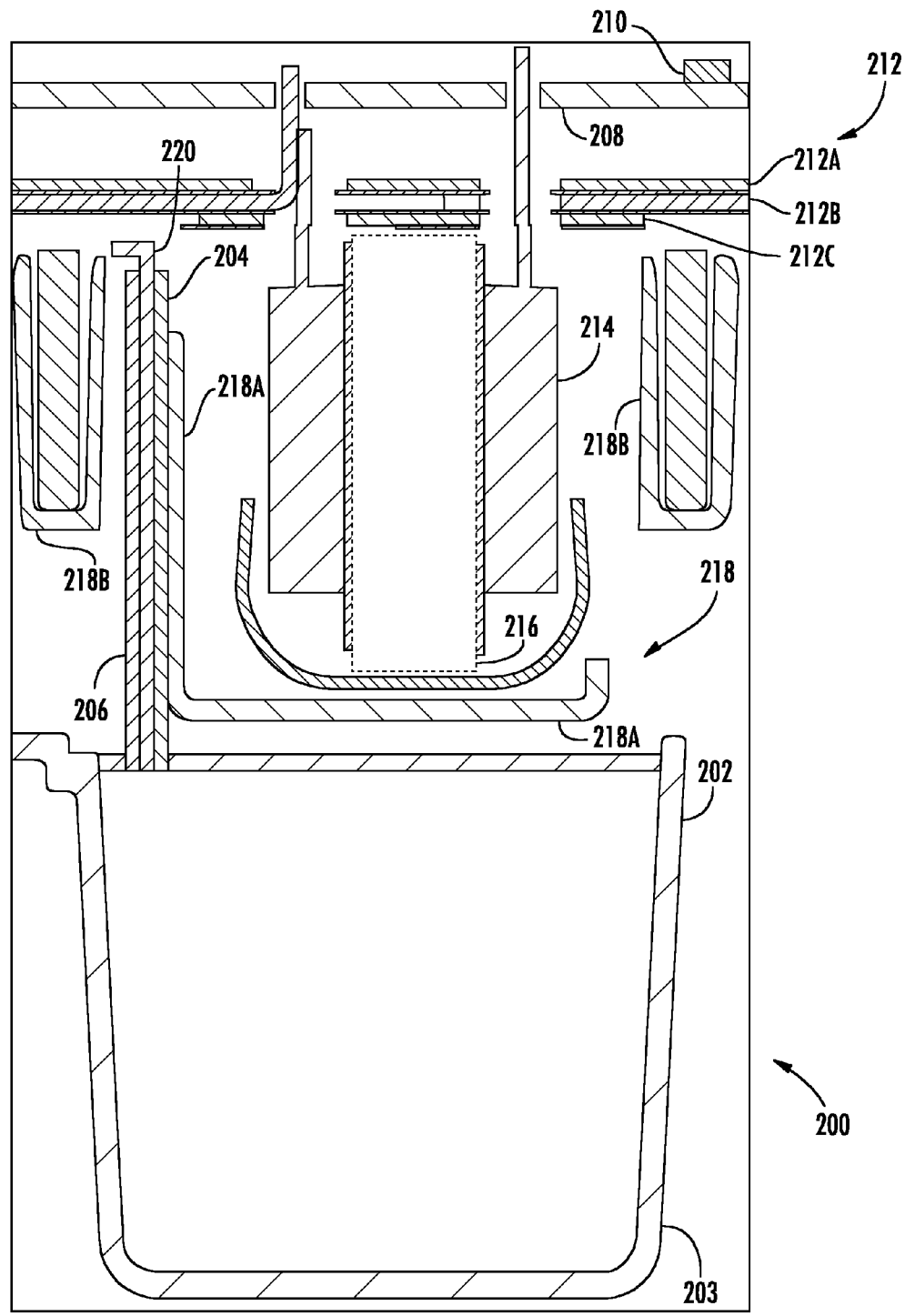
FIG. 2 is a cross section of an electronic component having a capacitor with planar terminals.

FIG. 2 is a cross section of an electronic component 200 having a capacitor 202 with a housing 203 and planar terminals 204 and 206. The electronic component has a circuit board 208 with one or more components 210 thereon, and a laminate busbar structure 212 that here includes busbar layers 212A-C separated by respective insulation layers. The busbar layers are made from a conductive material, such as copper.

Attached to the circuit board and to the busbars are transistors 214. Any of multiple different kinds of active switching devices can be used (e.g., IGBTs). For example, collector and emitter leads of the transistor can connect to two of the busbar layers 212A-C, and a gate lead can connect to the circuit board. In some implementations, the transistors are mounted onto a heatsink 216. For example, the heatsink can have an internal cavity to provide for circulation of coolant in thermal contact with the transistor(s). For example, this permits the transistors to be positioned on one side of the circuit board and to be arranged essentially perpendicularly thereto, for improved thermal management. In some implementations, the transistors 214 are arranged pairwise on opposite sides of the heatsink, with multiple pairs positioned along the length of the heatsink. Moreover, the terminals 204 and 206 allow the capacitor 202 to be mounted on the same side of the laminate busbar structure as the transistors, and be positioned further away from the laminate busbar structure than the transistors.

The electronic component here has a busbar locating component 218 that serves to position busbars as well as transistors, heatsinks, etc., relative to each other. A bay member 218A forms a bay in which the transistors 214 and the heatsink 216 are here positioned. A busbar slot 218B of the busbar locating component is used for positioning one or more busbars in the electronic component, for example in order to create connections with the laminate busbar structure 212.

The terminals 204 and 206 are here separated by a support structure 220. The support structure extends from the housing 203 and serves to hold the terminals and electrically insulate them from each other. The support structure can help position the busbar locating component. For example, the busbar locating component and the capacitor can be attached to each other at an initial stage of assembly, and the transistors 214, the heatsink 216, the laminate busbar structure 212 and the circuit board 208 can then be assembled onto the busbar locating component and thereby be positioned relative to each other.

The electronic component 200 can be used in multiple different installations. In some implementations, the electronic component forms an inverter that makes use of the transistors 214 for converting DC to AC. In such implementations, the capacitor 202 can be a DC link capacitor for the inverter. For example, the busbar layers 212 can then include at least first and second DC busbar layers and an AC busbar layer.

Figure 3:
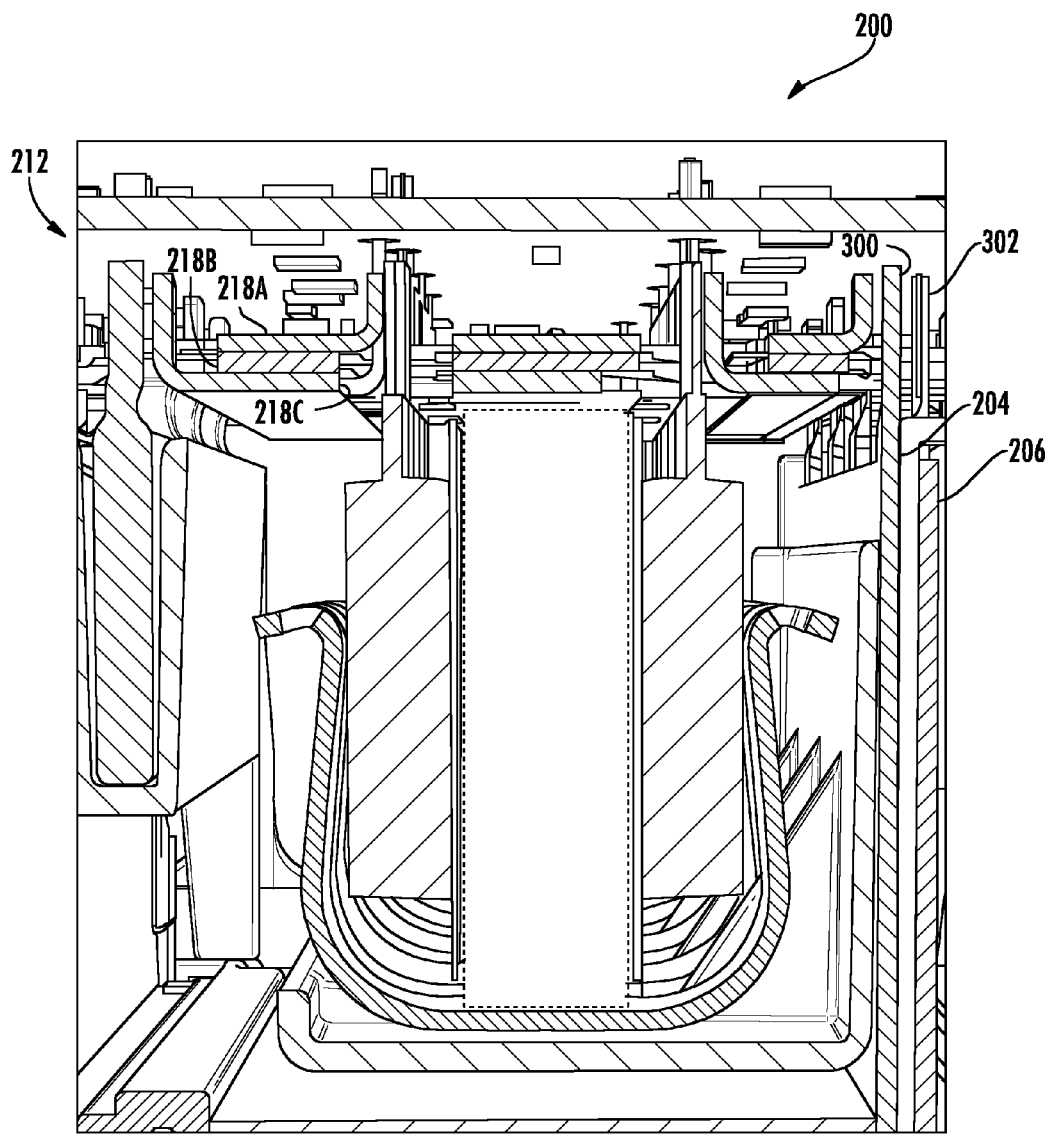
FIG. 3 is another cross section of the electronic component of FIG. 2.

FIG. 3 is another cross section of the electronic component 200 of FIG. 2. This view is taken is the opposite direction. It is here shown that the terminal 204 has respective leads 300 at the distal end thereof (i.e., the end opposite where the terminal is connected to the capacitor conductors). Similarly, the terminal 206 has respective leads 302 at its distal end. The leads allow the terminals to connect to corresponding ones of the busbar layers 212A-C. For example, each of the busbar layers 212A-C can have openings with corresponding tabs extending from peripheries thereof, and each of the tabs can be configured to align with and contact a corresponding one of the leads 300 and 302. The lead and the tab can therefore be joined, for example by welding. In some implementations, each of the leads 300 and 302 can be paired and positioned adjacent a respective one of the transistors 214.

A number of implementations have been described as examples. Nevertheless, other implementations are covered by the following claims.

What is claimed is:

1. An electronic component comprising:
   a laminate busbar structure comprising at least two busbar layers separated by an insulating layer;
   a transistor connected to the laminate busbar structure on a first side thereof; and
   a capacitor that is mounted on the first side of the laminate busbar structure and is positioned further away from the laminate busbar structure than the transistor, the capacitor having respective planar terminals parallel to each other and perpendicular to the laminate busbar structure, each of the planar terminals comprising a rectangular member with one side thereof connected to the capacitor and an opposite end connected to a corresponding one of the busbar layers.

2. The electronic component of claim 1, wherein the capacitor is enclosed in a housing and wherein the planar terminals extend outside the housing.

3. The electronic component of claim 2, wherein each rectangular member extends from end to end of the housing.

4. The electronic component of claim 2, further comprising a support structure for the rectangular members extending from the housing toward the laminate busbar structure.

5. The electronic component of claim 4, wherein the support structure holds the planar terminals by their edges and exposes outward facing surfaces of the rectangular members.

6. The electronic component of claim 4, wherein a portion of the support structure insulates the planar terminals from each other.

7. The electronic component of claim 4, wherein the support structure and the rectangular members are configured to position a busbar locating component relative to the electronic component, the busbar locating component configured to have the laminate busbar structure attached thereto.

8. The electronic component of claim 1, wherein the electronic component is an inverter that includes multiple transistors, the busbar layers include at least first and second DC busbar layers and an AC busbar layer, and the capacitor is a DC link capacitor for the inverter.

9. The electronic component of claim 8, wherein each of the planar terminals has multiple leads at the opposite end of the rectangular member, the leads connecting the respective planar terminal to the corresponding one of the busbar layers.

10. The electronic component of claim 9, wherein each of the busbar layers has openings with corresponding tabs extending from peripheries thereof, and wherein each of the tabs is configured to align with and contact a corresponding one of the multiple leads.

11. The electronic component of claim 9, wherein the leads of the respective planar terminals are paired and positioned adjacent a respective one of the multiple transistors.

\* \* \* \* \*